(12) United States Patent
Qian et al.

(10) Patent No.: US 9,584,127 B2
(45) Date of Patent: Feb. 28, 2017

(54) INVERTER, DRIVING CIRCUIT AND DISPLAY PANEL

(71) Applicants: Shanghai Tianma AM-OLED Co., Ltd., Shanghai (CN); Tianma Micro-Electronics Co., Ltd., Shenzhen (CN)

(72) Inventors: Dong Qian, Shanghai (CN); Yue Li, Shanghai (CN); Tong Zhang, Shanghai (CN); Zhiliang Wang, Shanghai (CN); Liyuan Luo, Shanghai (CN)

(73) Assignees: SHANGHAI TIANMA AM-OLED CO., LTD., Shanghai (CN); 03;TIANMA MICRO-ELECTRONICS CO., LTD., Shenzhen (CN)

( * ) Notice: Subject to any disclaimer, the term of this patent is extended or adjusted under 35 U.S.C. 154(b) by 149 days.

(21) Appl. No.: 14/586,810

(22) Filed: Dec. 30, 2014

(65) Prior Publication Data

US 2016/0105184 A1 Apr. 14, 2016

(30) Foreign Application Priority Data

Oct. 13, 2014 (CN) .......................... 2014 1 0538426

(51) Int. Cl.
*H03K 19/0944* (2006.01)
*H03K 19/003* (2006.01)
(Continued)

(52) U.S. Cl.
CPC ... *H03K 19/0944* (2013.01); *H03K 19/00315* (2013.01); *G09G 3/3266* (2013.01);
(Continued)

(58) Field of Classification Search
CPC ......... G09G 3/3266; G09G 2310/0286; G09G 2310/0291; G11C 19/184; H03K 19/0016; H03K 19/0027; H03K 19/01714
See application file for complete search history.

(56) References Cited

U.S. PATENT DOCUMENTS

2007/0188196 A1* 8/2007 Yu .................... H03K 19/01714
326/88
2012/0206432 A1 8/2012 Kang et al.
(Continued)

FOREIGN PATENT DOCUMENTS

CN 103268749 A 8/2013
KR 20080114365 A 12/2008

*Primary Examiner* — Viet Pham
(74) *Attorney, Agent, or Firm* — Anova Law Group, PLLC

(57) ABSTRACT

An inverter includes first, second, third, fourth, and fifth transistors, and first and second capacitors. The transistors and capacitors are connected in such way that the reverse conduction of the second transistor is prevented through controlling the gate electrode of the second transistor and maintaining the electrical potential at the gate electrode of the fifth transistor by the second capacitor. The electrical potential at the gate electrode of the fifth transistor is maintained stable when a first clock signal changes from high to low (when the first to fifth transistors are NMOS transistors) or from low to high (when the first to fifth transistors are PMOS transistors), so that the output signal of the inverter may not be affected by a change of the first clock signal, thus enabling the inverter to generate a stable output signal and a display panel comprising the inverter to obtain a better display effect.

19 Claims, 11 Drawing Sheets

(51) Int. Cl.
*H02M 1/00* (2006.01)
*G09G 3/32* (2016.01)
(52) U.S. Cl.
CPC ............. *G09G 2310/0291* (2013.01); *H02M 2001/0054* (2013.01)

(56) References Cited

U.S. PATENT DOCUMENTS

2013/0222352 A1* 8/2013 Jeong ................. G09G 3/3266
 345/205
2014/0145919 A1* 5/2014 Qian .................. G09G 3/3225
 345/82

* cited by examiner

INVERTER, DRIVING CIRCUIT AND DISPLAY PANEL

CROSS-REFERENCES TO RELATED APPLICATIONS

This application claims the benefit of priority to Chinese Patent Application No. 201410538426.2, filed with the Chinese Patent Office on Oct. 13, 2014 and entitled "INVERTER, DRIVING CIRCUIT AND DISPLAY PANEL", the content of which is incorporated herein by reference in its entirety.

TECHNICAL FIELD

The disclosure relates to the field of display technologies, and more particularly to an inverter, a driving circuit and a display panel.

BACKGROUND OF THE INVENTION

An inverter operates in response to an input signal to provide an output signal that is the inverse of the input signal. With the development of electronic technology, inverters are widely employed. For example, an inverter may be employed in a transmission driving circuit of an organic light-emitting display device to provide a corresponding electric potential for a pixel compensation circuit electrically connected with the transmission driving circuit, so that the pixel compensation circuit can accomplish node initialization, threshold value compensation, data writing and the like.

FIG. 1A is a circuit diagram of an inverter in the related art. As shown in FIG. 1A, the inverter includes a first transistor P1, a second transistor P2, a third transistor P3, a fourth transistor P4 and a capacitor C0, where the first to fourth transistors P1 to P4 are all P-Channel Metal Oxide Semiconductor (PMOS) transistors. A gate electrode of the first transistor P1 is electrically connected with an initial signal input terminal IN0 for receiving an initial signal, a source electrode of the first transistor P1 is electrically connected with a first electrical level signal input terminal VG1 for receiving a first electrical level signal, and a drain electrode of the first transistor P1 is electrically connected, via the capacitor C0, with a first clock signal input terminal CK1 for receiving a first clock signal; a gate electrode of the second transistor P2 is electrically connected with a second clock signal input terminal CK2 for receiving a second clock signal, a source electrode of the second transistor P2 is electrically connected with both the drain electrode of the first transistor P1 and a gate electrode of the fourth transistor P4, and a drain electrode of the second transistor P2 is electrically connected with a second electrical level signal input terminal VG2 for receiving a second electrical level signal; a gate electrode of the third transistor P3 is electrically connected with the initial signal input terminal IN0, a source electrode of the third transistor P3 is electrically connected with the first electrical level signal input terminal VG1, and a drain electrode of the third transistor P3 is electrically connected with an output terminal OUT0 for outputting an output signal; a source electrode of the fourth transistor P4 is electrically connected with the output terminal OUT0, and a drain electrode of the fourth transistor P4 is electrically connected with the second electrical level signal input terminal VG2. Here, the first electrical level signal is a constant high level signal, and the second electrical level signal is a constant low level signal.

FIG. 1B is a diagram showing waveforms of various signals of the inverter shown in FIG. 1A. As shown in FIG. 1B, SIN0 represents the initial signal, SCK1 represents the first clock signal, SCK2 represents the second clock signal, and SOUT0 represents the output signal. When the first clock signal SCK1 changes from a low level to a high level, an electric potential of the gate electrode of the fourth transistor P4 is affected and hence the turning-on of the fourth transistor P4 is affected because of an Bootstrap effect of the capacitor C0 (i.e. electric charge of the capacitor C0 is conserved), so that transmission of the second electrical level signal to the output terminal OUT via the fourth transistor P4 is affected, and the value of a low level of the output signal SOUT0 is affected, thus resulting in instability of the output signal.

BRIEF SUMMARY OF THE INVENTION

In view of the above problems, embodiments of the disclosure provide an inverter, a driving circuit and a display panel that provide a stable output signal when a first clock signal changes from a low level to a high level.

In a first aspect, an embodiment of the disclosure provides an inverter. The inverter includes a first transistor, a second transistor, a third transistor, a fourth transistor, a fifth transistor, a first capacitor, and a second capacitor;

a gate electrode of the first transistor is electrically connected with an initial signal input terminal for receiving an initial signal, a source electrode of the first transistor is electrically connected with a first electrical level signal input terminal for receiving a first electrical level signal, and a drain electrode of the first transistor is electrically connected with a source electrode of the second transistor and a gate electrode of the fifth transistor;

a drain electrode of the second transistor is electrically connected, via the first capacitor, with a first clock signal input terminal for receiving a first clock signal;

a gate electrode of the third transistor is electrically connected with a second clock signal input terminal for receiving a second clock signal, a source electrode of the third transistor is electrically connected with the drain electrode of the second transistor, and a drain electrode of the third transistor is electrically connected with a second electrical level signal input terminal for receiving a second electrical level signal;

a gate electrode of the fourth transistor is electrically connected with the initial signal input terminal, a source electrode of the fourth transistor is electrically connected with the first electrical level signal input terminal, and a drain electrode of the fourth transistor is electrically connected with an output terminal for outputting an output signal; and a source electrode of the fifth transistor is electrically connected with the output terminal, and a drain electrode of the fifth transistor is electrically connected with the second electrical level signal input terminal;

wherein the gate electrode of the second transistor is controlled in such a way to prevent reverse conduction of the second transistor, the second capacitor is configured to maintain an electrical potential at the gate electrode of the fifth transistor, and the initial signal and the output signal are inverse to each other.

In a second aspect, an embodiment of the disclosure provides a driving circuit, which includes the inverter described in the first aspect.

In a third aspect, an embodiment of the disclosure provides a display panel, which includes the driving circuit described in the second aspect.

With the inverter, the driving circuit and the display panel provided by embodiments of the disclosure, the reverse conduction of the second transistor is prevented through the control over the gate electrode of the second transistor, and the electrical potential at the gate electrode of the fifth transistor is maintained by the second capacitor. The electrical potential at the gate electrode of the fifth transistor can be maintained stable when the first clock signal changes from a high level to a low level (when the first to fifth transistors are all NMOS transistors) or from a low level to a high level (when the first to fifth transistors are all PMOS transistors), so that the output signal of the inverter may not be affected by the change of the first clock signal, thus enabling the inverter to generate a stable output signal and enabling the display panel comprising the inverter to obtain a better display effect.

BRIEF DESCRIPTION OF THE DRAWINGS

Other features, objects and advantages of the present disclosure will become apparent from the following detailed description made to nonrestrictive embodiments with reference to the accompanying drawings below, in which.

DETAILED DESCRIPTION OF THE PREFERRED EMBODIMENTS

Figure 1A:
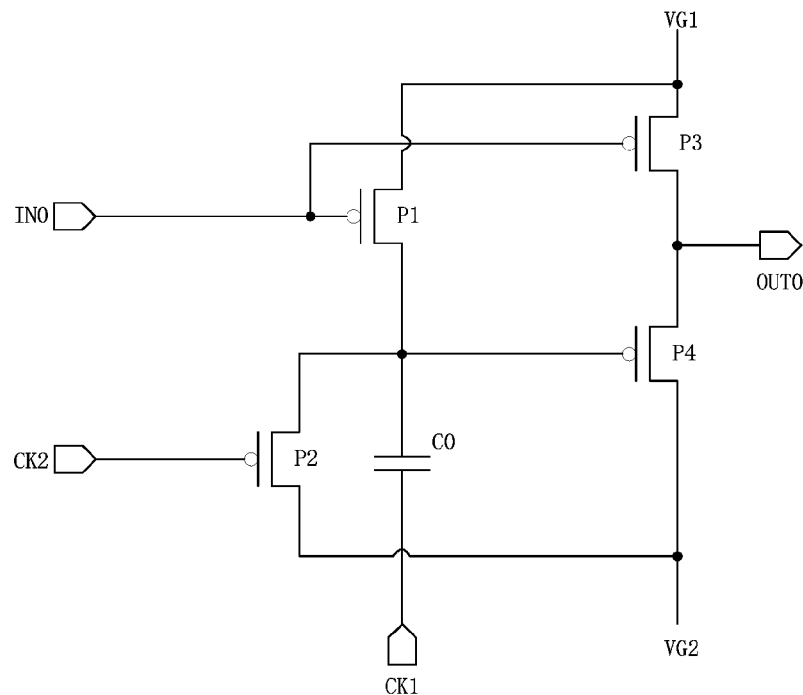
FIG. 1A is a circuit diagram of an inverter in the related art.
Figure 1B:
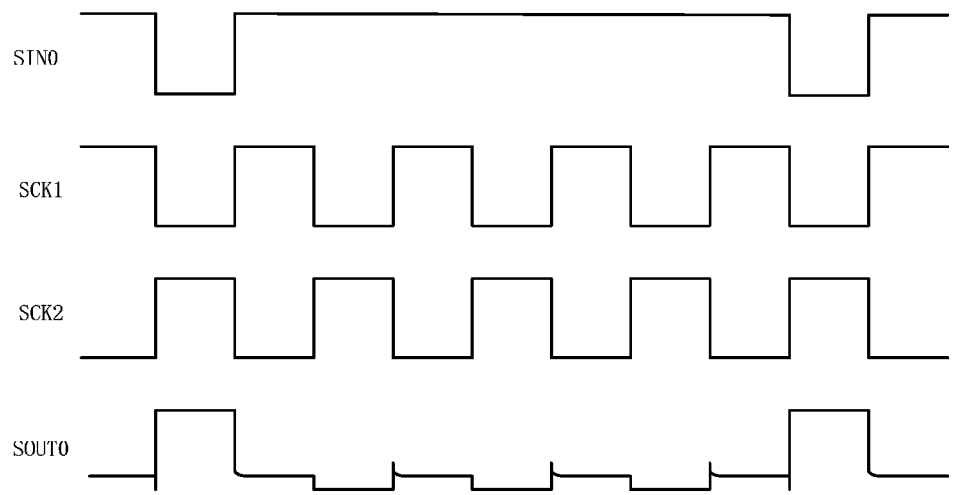
FIG. 1B is a diagram showing waveforms of various signals of the inverter shown in FIG. 1A.

The present disclosure will be further described in detail below in conjunction with the accompanying drawings and embodiments. It is understood that specific embodiments described herein are merely for explaining the present disclosure rather than limiting the present disclosure. Additionally, it is noted that only portions relevant to the present disclosure rather than all portions are described in the accompanying drawings for purposes of clarity.

First Embodiment

The first embodiment of the disclosure provides an inverter, including a first transistor, a second transistor, a third transistor, a fourth transistor, a fifth transistor, a first capacitor and a second capacitor. A gate electrode of the first transistor is electrically connected with an initial signal input terminal for receiving an initial signal, a source electrode of the first transistor is electrically connected with a first electrical level signal input terminal for receiving a first electrical level signal, and a drain electrode of the first transistor is electrically connected with a source electrode of the second transistor and a gate electrode of the fifth transistor; a drain electrode of the second transistor is electrically connected, via the first capacitor, with a first clock signal input terminal for receiving a first clock signal. A gate electrode of the third transistor is electrically connected with a second clock signal input terminal for receiving a second clock signal, a source electrode of the third transistor is electrically connected with the drain electrode of the second transistor, and a drain electrode of the third transistor is electrically connected with a second electrical level signal input terminal for receiving a second electrical level signal. A gate electrode of the fourth transistor is electrically connected with the initial signal input terminal, a source electrode of the fourth transistor is electrically connected with the first electrical level signal input terminal, and a drain electrode of the fourth transistor is electrically connected with an output terminal for outputting an output signal; a source electrode of the fifth transistor is electrically connected with the output terminal, and a drain electrode of the fifth transistor is electrically connected with the second electrical level signal input terminal. The second transistor has its gate electrode controlled in such a way to prevent reverse conduction of the second transistor. The second capacitor is configured to maintain the electrical potential at the gate electrode of the fifth transistor, and the initial signal and the output signal are inverse to each other.

In addition to the implementation of the invertor function based on the various transistors and capacitors included in the inverter, the reverse conduction of the second transistor is prevented by controlling the gate electrode of the second transistor, and the electrical potential at the gate electrode of the fifth transistor is maintained by the second capacitor. The electrical potential at the gate electrode of the fifth transistor can be maintained stable when the first clock signal changes from a high level to a low level (in the case where the first to fifth transistors are all N-Channel Metal Oxide Semiconductor (NMOS) transistors) or from a low level to a high level (in the case where the first to fifth transistors are all PMOS transistors), so that the output signal of the inverter may not be affected by the change of the first clock signal, thus enabling the inverter to generate a stable output signal.

Further, in the first embodiment, the first transistor, the second transistor, the third transistor, the fourth transistor and the fifth transistor are all NMOS transistors or PMOS transistors. In following various embodiments regarding the inverter, description is made by an example where all the transistors are PMOS transistors. However, it is understood that all the transistors can be NMOS transistors, where high levels of various signals correspond to low levels of the signals in the case where all the transistors are PMOS transistors, and low levels of various signals correspond to high levels of the signals in the case where all the transistors are PMOS transistors.

Further, in the first embodiment, the initial signal, the output signal, the first clock signal and the second clock signal are all pulse signals, where the first clock signal and the second clock signal are inverse to each other. It should be noted that the value of a high level of the initial signal, the output signal, the first clock signal and the second clock signal may be set at 10V, and the value of a low level thereof may be set at −5V, or may be set at other values according to the types of the transistors and actual requirements.

Further, in the first embodiment, both the first electrical level signal and the second electrical level signal are constant. It should be noted that when the first to fifth transistors are all PMOS transistors, the first electrical level signal is a high level signal which may have a level of 10V, and the second electrical level signal is a low level signal which may have a level of −5V. Likewise, when the first to fifth transistors are all NMOS transistors, the first electrical level signal is a low level signal which may have a level of −5V, and the second electrical level signal is a high level signal which may have a level of 10V. Of course, the level of the first electrical level signal and the second electrical level signal may be set at other values according to actual requirements.

Based on the above-described principles, given that the function of the inverter can be achieved, the circuit structure of the inverter, including for example a position at which the gate electrode of the second transistor is electrically connected and a position at which the second capacitor is electrically connected, may be implemented in various ways, as long as the output signal of the inverter is not affected by the change of the first clock signal and maintains stable when the first clock signal changes from a low level to a high level (in the case of description below made by taking an example where the first to fifth transistors are all PMOS transistors). Preferred embodiments are illustrated in detail below.

Second Embodiment

Figure 2A:
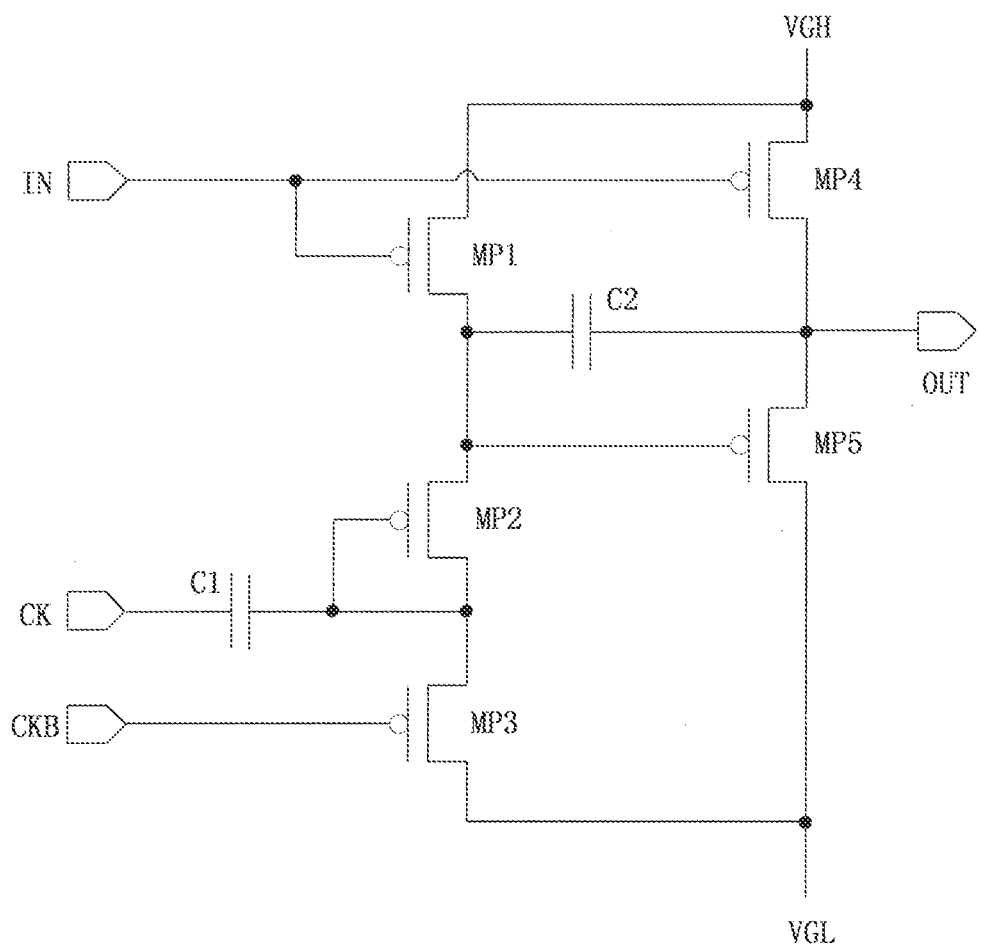
FIG. 2A is a circuit diagram of an inverter according to a second embodiment of the disclosure.

FIG. 2A is a circuit diagram of an inverter according to a second embodiment of the disclosure. As shown in FIG. 2A, an inverter in the second embodiment of the disclosure includes a first transistor MP1, a second transistor MP2, a third transistor MP3, a fourth transistor MP4, a fifth transistor MP5, a first capacitor C1 and a second capacitor C2. A gate electrode of the first transistor MP1 is electrically connected with an initial signal input terminal IN for receiving an initial signal, a source electrode of the first transistor MP1 is electrically connected with a first electrical level signal input terminal VGH for receiving a first electrical level signal, and a drain electrode of the first transistor MP1 is electrically connected with a source electrode of the second transistor MP2 and a gate electrode of the fifth transistor MP5. A gate electrode of the second transistor MP2 is electrically connected with a drain electrode of the second transistor MP2, and the drain electrode of the second transistor MP2 is further electrically connected, via the first capacitor C1, with a first clock signal input terminal CK for receiving a first clock signal. A gate electrode of the third transistor MP3 is electrically connected with a second clock signal input terminal CKB for receiving a second clock signal, a source electrode of the third transistor MP3 is electrically connected with the drain electrode of the second transistor MP2, and a drain electrode of the third transistor MP3 is electrically connected with a second electrical level signal input terminal VGL for receiving a second electrical level signal. A gate electrode of the fourth transistor MP4 is electrically connected with the initial signal input terminal IN, a source electrode of the fourth transistor MP4 is electrically connected with the first electrical level signal input terminal VGH, and a drain electrode of the fourth transistor MP4 is electrically connected with an output terminal OUT for outputting an output signal. A gate electrode of the fifth transistor MP5 is electrically connected with the output terminal OUT via the second capacitor C2, a source electrode of the fifth transistor MP5 is electrically connected with the output terminal OUT, and a drain electrode of the fifth transistor MP5 is electrically connected with the second electrical level signal input terminal VGL.

Based on the above-described first embodiment, in the second embodiment, the reverse conduction of the second transistor MP2 is prevented by electrically connecting the gate electrode of the second transistor MP2 with the drain electrode of the second transistor MP2 to form a diode, and the electrical potential at the gate electrode of the fifth transistor MP5 is maintained through the second capacitor C2 by electrically connecting the gate electrode of the fifth transistor MP5 with the output terminal OUT via the second capacitor C2.

Figure 2B:
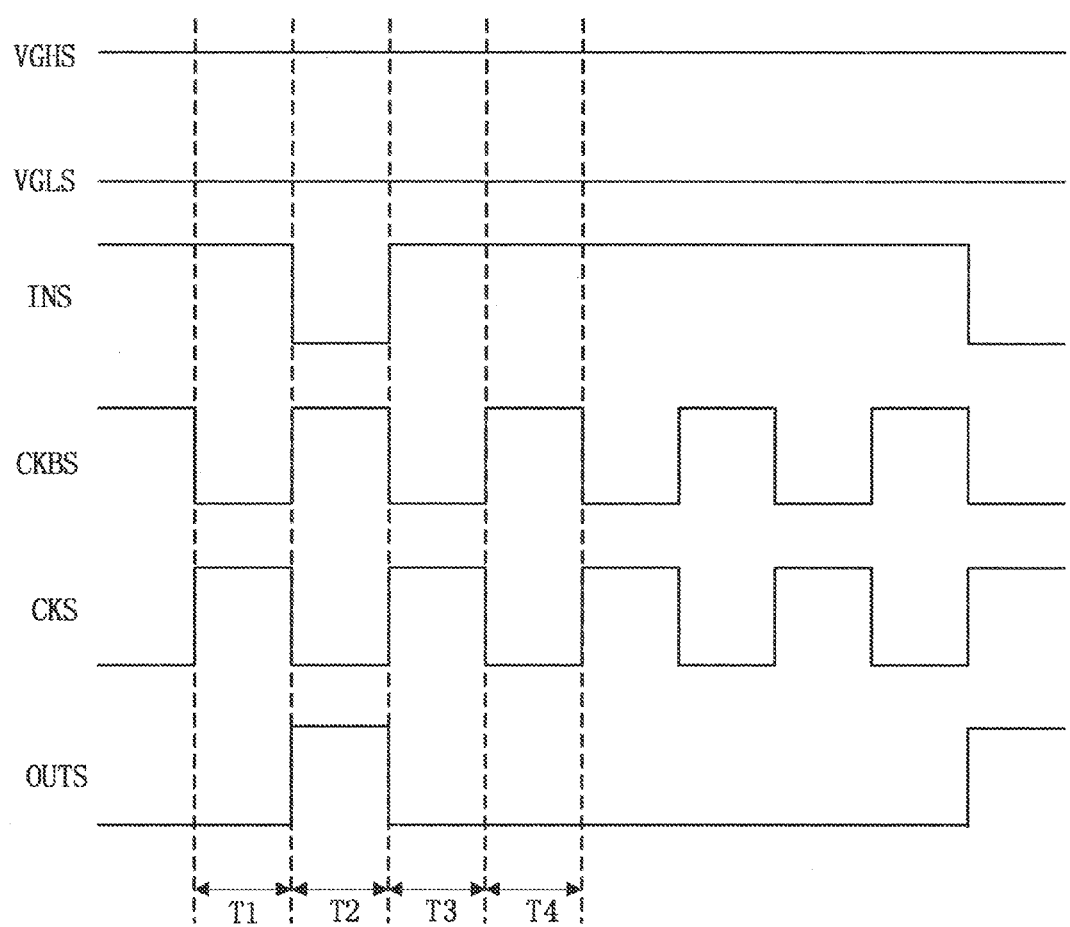
FIG. 2B is a diagram showing waveforms of various signals of the inverter shown in FIG. 2A.

FIG. 2B is a diagram showing waveforms of various signals of the inverter shown in FIG. 2A. As shown in FIG. 2B, INS represents the initial signal, CKS represents the first clock signal, CKBS represents the second clock signal, VGHS represents the first electrical level signal, VGLS represents the second electrical level signal, and OUTS represents the output signal. It should be noted that, in FIG. 2B, the first electrical level signal VGHS is a constant high level signal, and the second electrical level signal VGLS is a constant low level signal.

Figure 3A:
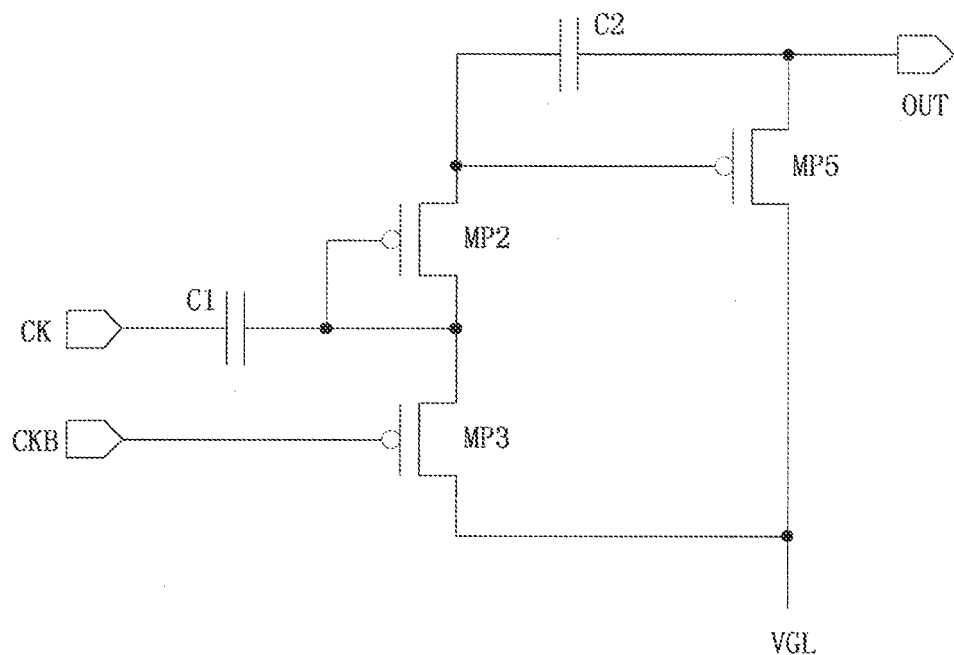
FIGS. 3A to 3C are equivalent circuit diagrams of the inverter shown in FIG. 2A corresponding to various stages shown in FIG. 2B.
Figure 3B:
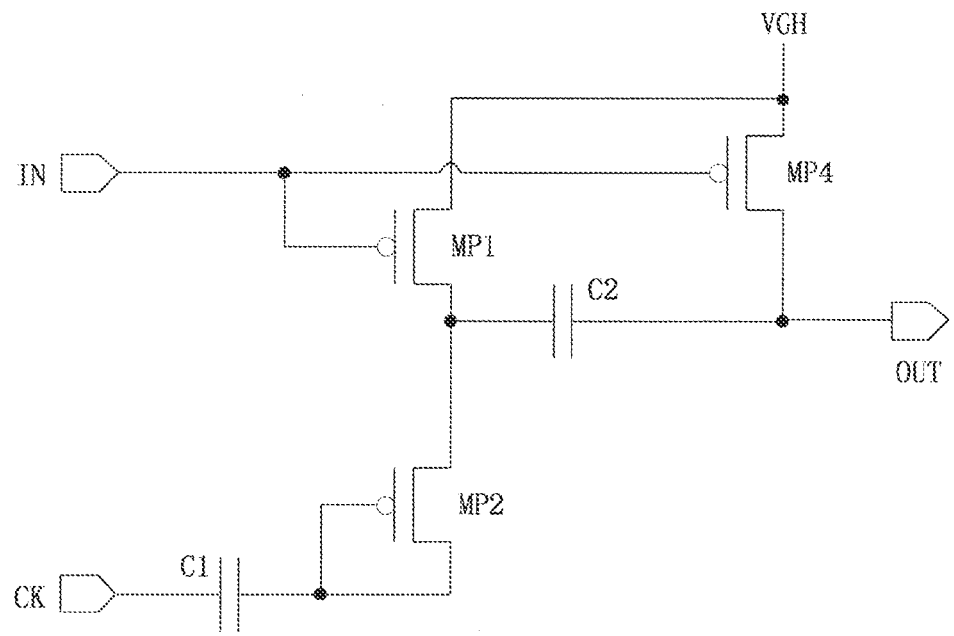
Figure 3C:
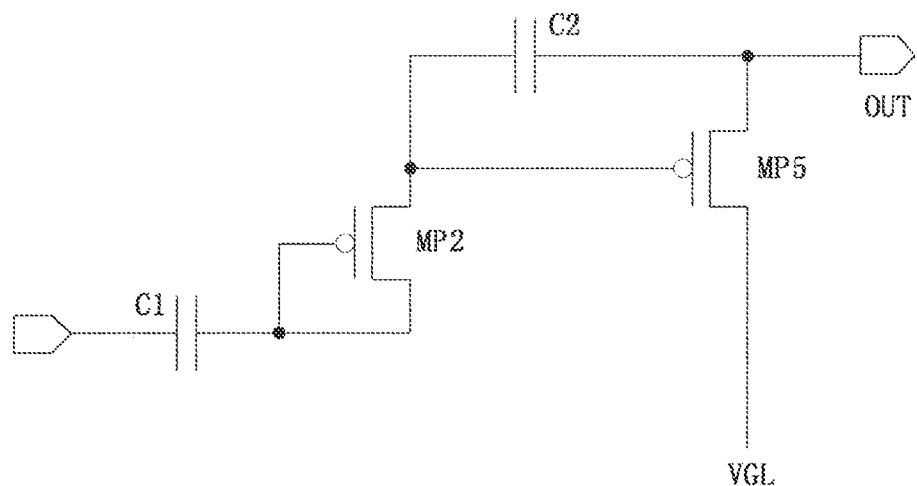

FIGS. 3A to 3C are equivalent circuit diagrams of the inverter shown in FIG. 2A corresponding to various stages shown in FIG. 2B. Referring to FIGS. 2B and 3A to 3C, the inverter has four operation stages including a first stage T1, a second stage T2, a third stage T3 and a fourth stage T4.

At the first stage T1, as shown in FIGS. 2B and 3A, the initial signal INS has a high level to turn off the first transistor MP1 and the fourth transistor MP4, the second clock signal CKBS has a low level to turn on the third transistor MP3, the second electrical level signal VGLS has a low level and is transmitted to the gate electrode of the second transistor MP2 via the third transistor MP3 to turn on the second transistor MP2, and then further transmitted to the gate electrode of the fifth transistor MP5 via the second transistor MP2 to turn on the fifth transistor MP5, so that the second electrical level signal VGLS is transmitted to the output terminal OUT via the fifth transistor MP5 as an output signal OUTS of the first stage T1. In addition, the output signal OUTS of the first stage T1 is a low level signal, which is inverse to the initial signal INS, therefore the function of the inverter is accomplished at the first stage T1.

At the second stage T2, as shown in FIGS. 2B and 3B, the initial signal INS has a low level to turn on the first transistor MP1 and the fourth transistor MP4, the first electrical level signal VGHS has a high level and is transmitted to the gate electrode of the fifth transistor MP5 via the first transistor MP1 to turn off the fifth transistor MP5, the second clock signal CKBS has a high level to turn off the third transistor MP3, and the first electrical level signal VGHS is transmitted to the output terminal OUT via the fourth transistor MP4 as an output signal OUTS of the second stage T2. In addition, the output signal OUTS of the second stage T2 is a high level signal, which is inverse to the initial signal INS, therefore the function of the inverter is accomplished at the second stage T2.

It should be noted that, in the second stage T2, the second clock signal CKBS has a high level to turn off the third transistor MP3. Since the first clock signal CKS in the second stage T2 has a low level, the electrical potential at the gate electrode of the second transistor MP2 is lowered because of the Bootstrap effect of the first capacitor C1 (i.e. electric charge of the first capacitor C1 is conserved), so that the second transistor MP2 is turned on. The first electrical level signal VGHS has a high level and charges the gate electrode of the second transistor MP2 through the first transistor MP1 and the second transistor MP2, so that the second transistor MP2 is turned off when the electrical potential at the gate electrode of the second transistor MP2 rapidly reaches a difference between the gate electrode voltage of the fifth transistor MP5 and an absolute value of a threshold voltage of the second transistor MP2, and in the meantime, the electrical potential at the gate electrode of the fifth transistor MP5 remains at a high level.

At the third stage T3, as shown in FIG. 3A (the equivalent circuit diagram of the inverter at the third stage T3 is the same as that at the first stage T1), the initial signal INS has a high level to turn off the first transistor MP1 and the fourth transistor MP4, the second clock signal CKBS has a low level to turn on the third transistor MP3, the second electrical level signal VGLS has a low level and is transmitted to the gate electrode of the second transistor MP2 via the third transistor MP3 to turn on the second transistor MP2, and then further transmitted to the gate electrode of the fifth transistor MP5 via the second transistor MP2 to turn on the fifth transistor MP5, then the second electrical level signal VGLS is transmitted to the output terminal OUT via the fifth transistor MP5 as an output signal OUTS of the third stage T3. In addition, the output signal OUTS of the third stage T3 is a low level signal, which is inverse to the initial signal INS, therefore the function of the inverter is accomplished at the third stage T3.

It should be noted that, in the third stage T3, the second clock signal CKBS has a low level to turn on the third transistor MP3, so that the electrical potential at the gate electrode of the second transistor MP2 is lowered, and the third transistor MP3 is turned off when the electrical potential at the gate electrode of the second transistor MP2 reaches a sum of a level value of the second clock signal CKBS and an absolute value of a threshold voltage of the third transistor MP3 (because the source electrode of the third transistor MP3 is electrically connected with the gate electrode of the second transistor MP2). In addition, when the output signal OUTS changes from a high level to a low level, the electrical potential at the gate electrode of the fifth transistor MP5 is much lowered because of the Bootstrap effect of the second capacitor C2, thus ensuring that the fifth transistor MP5 is completely turned on and the output terminal OUT can completely output a low level of the second electrical level signal VGLS; therefore, when the first clock signal CKS changes from a low level to a high level, the first clock signal CKS will not affect the electrical potential at the gate electrode of the fifth transistor MP5, and hence will not affect a level value of the output signal OUTS at the output terminal OUT, so that the resultant output signal OUTS is stable.

At the fourth stage T4, as shown in FIG. 3C, the initial signal INS has a high level to turn off the first transistor MP1 and the fourth transistor MP4, the second clock signal CKBS has a high level to turn off the third transistor MP3, the first clock signal CKS controls the electrical potential at the gate electrode of the second transistor MP2 via the first capacitor C1 to turn on the second transistor MP2, the electrical potential at the gate electrode of the second transistor MP2 controls the electrical potential at the gate electrode of the fifth transistor MP5 via the second transistor MP2 to turn on the fifth transistor MP5, and the second electrical level signal VGLS is transmitted to the output terminal OUT via the fifth transistor MP5 as an output signal OUTS of the fourth stage T4. In addition, the output signal OUTS of the fourth stage T4 is a low level signal, which is inverse to the initial signal INS, therefore the function of the inverter is accomplished at the fourth stage T4.

It should be noted that, in the fourth stage T4, the initial signal INS has a high level to turn off the first transistor MP1, the second clock signal CKBS has a high level to turn off the third transistor MP3, and the electrical potential at the gate electrode of the second transistor MP2 become lower because of the Bootstrap effect of the first capacitor C1 when the first clock signal CKS changes from a high level to a low level, so that the second transistor MP2 is turned on and further the electrical potential at the gate electrode of the fifth transistor MP5 is low, and the fifth transistor MP5 continuously transmits the level value of the second electrical level signal VGLS to the output terminal OUT, therefore, when the first clock signal CKS changes from a high level to a low level, a level value of the output signal OUTS of the output terminal OUT will not be affected, so that the resultant output signal OUTS is stable.

It can be seen from FIG. 2B, the inverter operates alternately in the third stage T3 and the fourth stage T4 between two adjacent second stages T2, in addition, the output signal OUTS of the inverter of the second embodiment in the third stage T3 and the fourth stage T4 is not affected by the change of the first clock signal CKS, therefore the inverter of the second embodiment may obtain a stable output signal OUTS.

Figure 4:
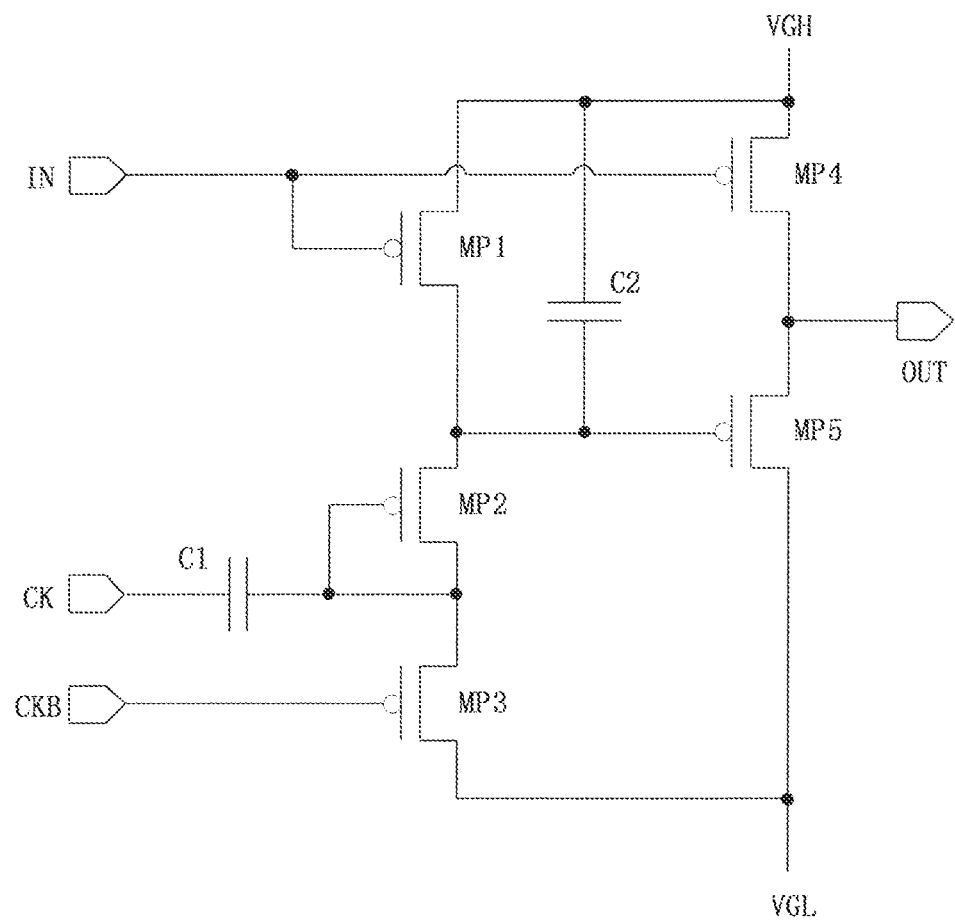
FIG. 4 is a circuit diagram of another inverter according to the second embodiment of the disclosure.

Moreover, FIG. 2A is only a specific example showing an electrical connection of the gate electrode of the fifth transistor MP5 and the second capacitor. In another specific example, as shown in FIG. 4, the gate electrode of the fifth transistor MP5 is electrically connected with the first electrical level signal input terminal VGH via the second capacitor C2, in this case, the operation stages of the inverter shown in FIG. 4 are the same as those of the inverter shown in FIG. 2A. However, compared with the inverter shown in FIG. 2A, in the third stage T3 of the inverter shown in FIG. 4, the electrical potential at the gate electrode of the fifth transistor MP5 will not be lowered even if the output signal OUTS changes from a high level to a low level.

Third Embodiment

Figure 5A:
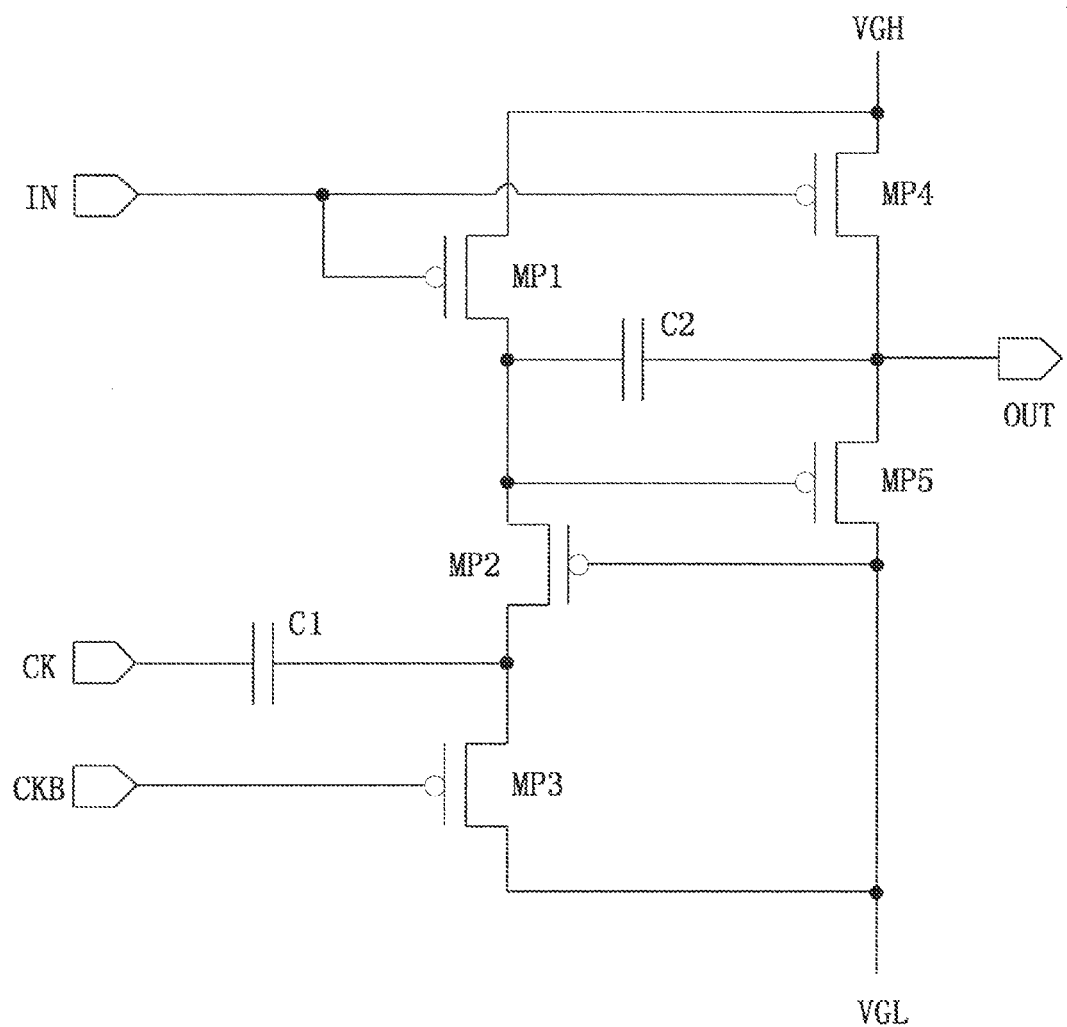
FIG. 5A is a circuit diagram of an inverter according to a third embodiment of the disclosure.

FIG. 5A is a circuit diagram of an inverter according to a third embodiment of the disclosure. As shown in FIG. 5A, an inverter in the third embodiment of the disclosure includes a first transistor MP1, a second transistor MP2, a third transistor MP3, a fourth transistor MP4, a fifth transistor MP5, a first capacitor C1 and a second capacitor C2. A gate electrode of the first transistor MP1 is electrically connected with an initial signal input terminal IN for receiving an initial signal, a source electrode of the first transistor MP1 is electrically connected with a first electrical level signal input terminal VGH for receiving a first electrical level signal, and a drain electrode of the first transistor MP1 is electrically connected with a source electrode of the second transistor MP2 and a gate electrode of the fifth transistor MP5. A gate electrode of the second transistor MP2 is electrically connected with the second electrical level signal input terminal VGL, and the drain electrode of the second transistor MP2 is electrically connected, via the first capacitor C1, with a first clock signal input terminal CK for receiving a first clock signal. A gate electrode of the third transistor MP3 is electrically connected with a second clock signal input terminal CKB for receiving a second clock signal, a source electrode of the third transistor MP3 is electrically connected with the drain electrode of the second transistor MP2, and a drain electrode of the third transistor MP3 is electrically connected with the second electrical level signal input terminal VGL for receiving a second electrical level signal. A gate electrode of the fourth transistor MP4 is electrically connected with the initial signal input terminal IN, a source electrode of the fourth transistor MP4 is electrically connected with the first electrical level signal input terminal VGH, and a drain electrode of the fourth transistor MP4 is electrically connected with an output terminal OUT for outputting an output signal. A gate electrode of the fifth transistor MP5 is electrically connected with the output terminal OUT via the second capacitor C2, a source electrode of the fifth transistor MP5 is electrically connected with the output terminal OUT, and a drain electrode of the fifth transistor MP5 is electrically connected with the second electrical level signal input terminal VGL.

As shown in FIG. 5A, in the third embodiment based on the first embodiment, the gate electrode of the second transistor MP2 is electrically connected with the second electrical level signal input terminal VGL, so that the second transistor MP2 is continuously turned on, and therefore reverse conduction of the second transistor MP2 may be prevented; further, the gate electrode of the fifth transistor MP5 is electrically connected with the output terminal OUT via the second capacitor C2, so that the electrical potential at the gate electrode of the fifth transistor MP5 is maintained via the second capacitor C2.

Figure 5B:
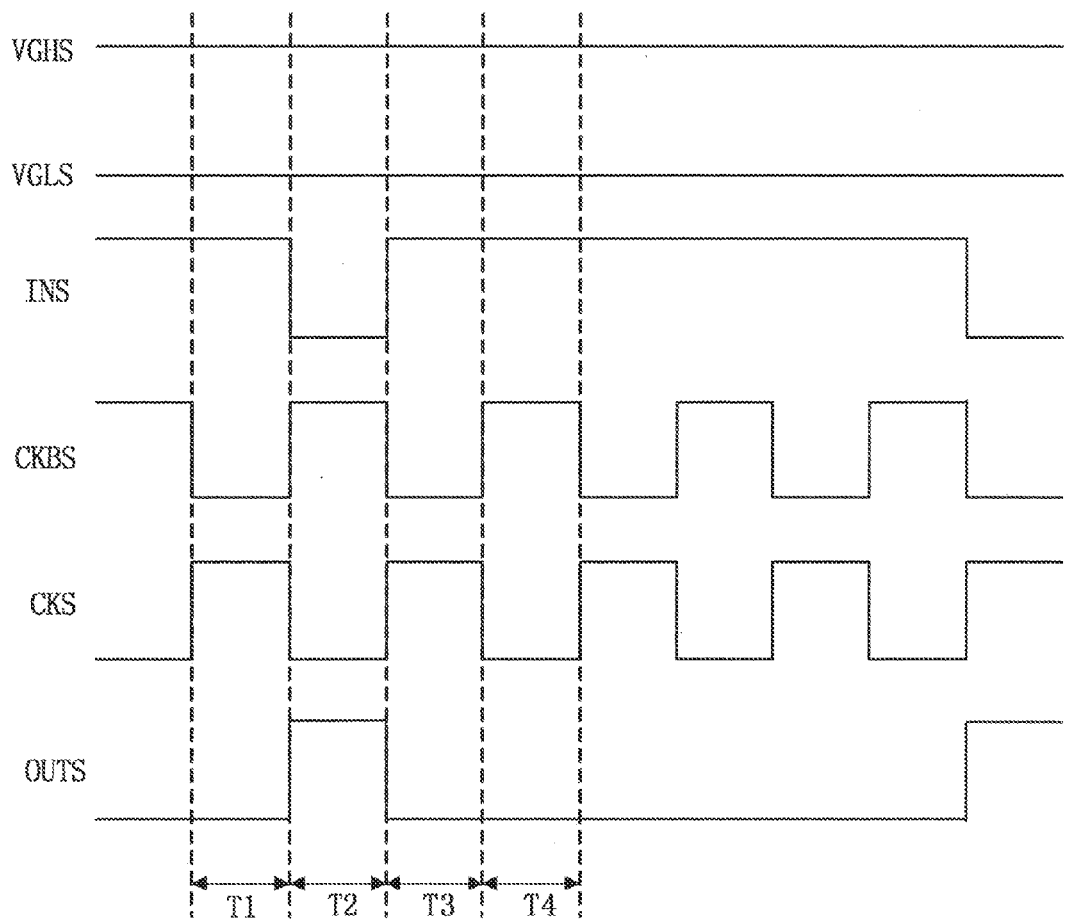
FIG. 5B is a diagram showing waveforms of various signals of the inverter shown in FIG. 5A.

FIG. 5B is a diagram showing waveforms of various signals of the inverter shown in FIG. 5A. As shown in FIG. 5B, INS represents the initial signal, CKS represents the first clock signal, CKBS represents the second clock signal, VGHS represents the first electrical level signal, VGLS represents the second electrical level signal, and OUTS represents the output signal. It should be noted that, in FIG. 5B, the first electrical level signal VGHS is a constant high level signal, and the second electrical level signal VGLS is a constant low level signal.

Figure 6A:
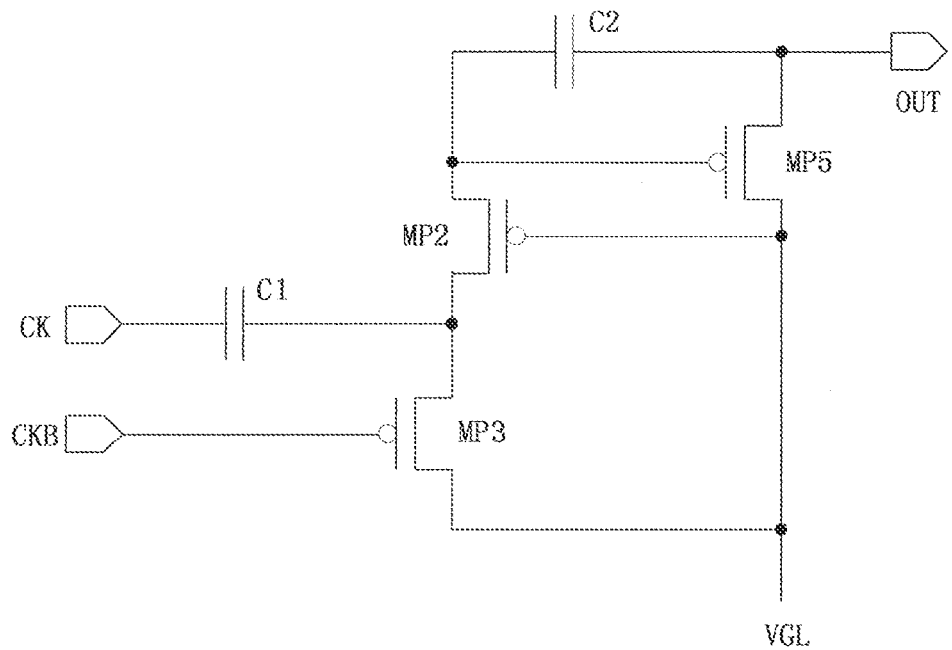
FIGS. 6A to 6C are equivalent circuit diagrams of the inverter shown in FIG. 5A corresponding to various stages shown in FIG. 5B.
Figure 6B:
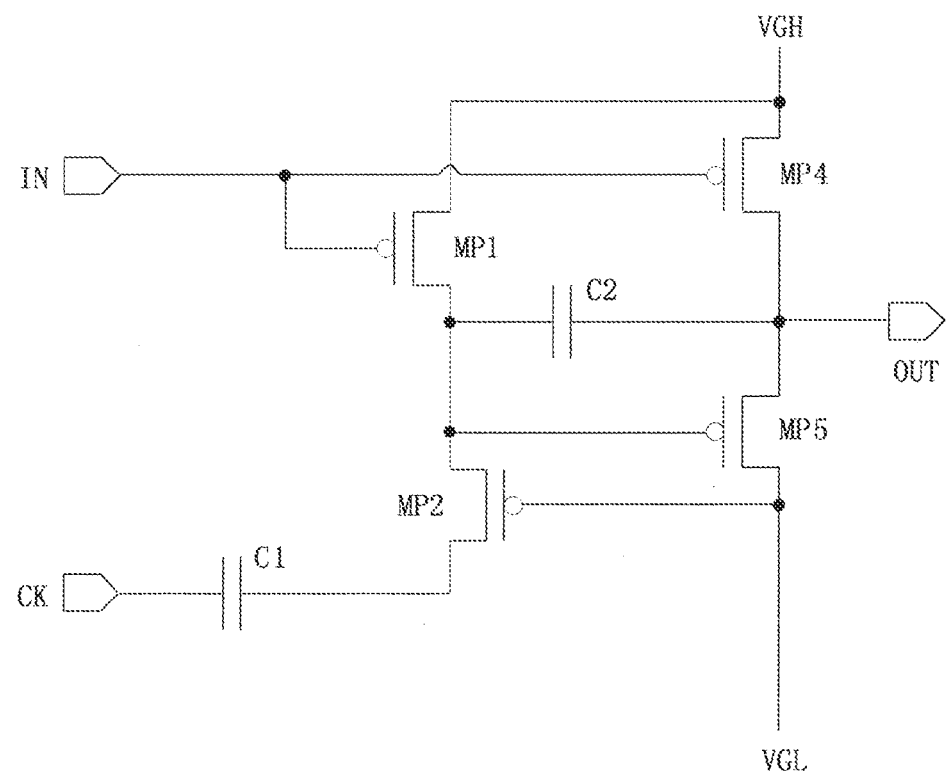
Figure 6C:
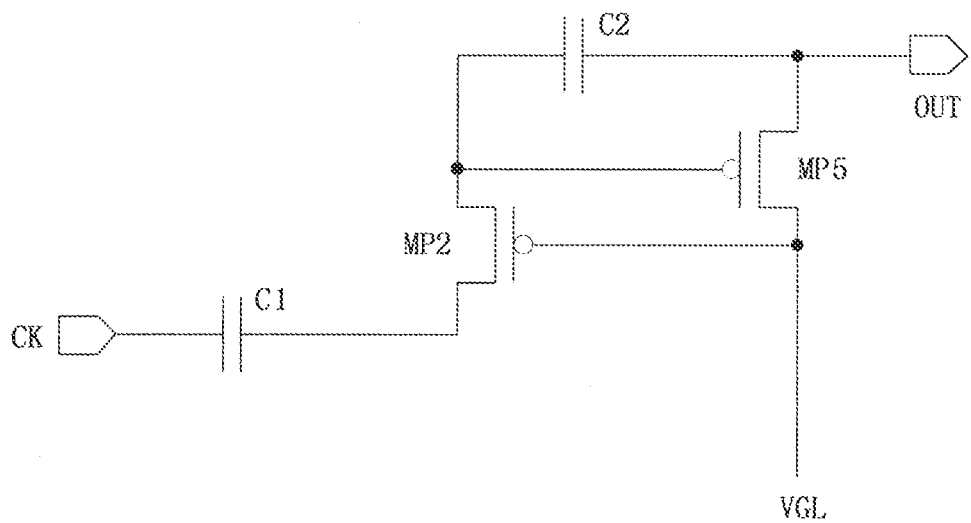

FIGS. 6A to 6C are equivalent circuit diagrams of the inverter shown in FIG. 5A corresponding to various stages shown in FIG. 5B. See FIGS. 5B and 6A to 6C, the working status of the inverter includes a first stage T1, a second stage T2, a third stage T3 and a fourth stage T4.

At the first stage T1, as shown in FIGS. 5B and 6A, the initial signal INS has a high level to turn off the first transistor MP1 and the fourth transistor MP4, the second clock signal CKBS has a low level to turn on the third transistor MP3, the second electrical level signal VGLS has a low level and controls the second transistor MP2 to turn on, the second electrical level signal VGLS is transmitted to the gate electrode of the fifth transistor MP5 via the third transistor MP3 and the second transistor MP2 in turn to control the fifth transistor MP5 to turn on, so that the second electrical level signal VGLS is transmitted to the output terminal OUT via the fifth transistor MP5 as an output signal OUTS of the first stage T1. In addition, the output signal OUTS of the first stage T1 is a low level signal, which is inverse to the initial signal INS, therefore the function of the inverter is accomplished at the first stage T1.

At the second stage T2, as shown in FIG. 6B, the initial signal INS has a low level to turn on the first transistor MP1 and the fourth transistor MP4, the first electrical level signal VGHS has a high level and is transmitted to the gate electrode of the fifth transistor MP5 via the first transistor MP1 to turn off the fifth transistor MP5, the second electrical level signal VGLS has a low level to keep the second transistor MP2 turned on, the second clock signal CKBS has a high level to turn off the third transistor MP3, so that the first electrical level signal VGHS is transmitted to the output terminal OUT via the fourth transistor MP4 as an output signal OUTS of the second stage T2. In addition, the output signal OUTS of the second stage T2 is a high level signal, which is inverse to the initial signal INS, therefore the function of the inverter is accomplished at the second stage T2.

At the third stage T3, as shown in FIG. 6A (the equivalent circuit diagram of the inverter at the third stage T3 is the same as that at the first stage T1), the initial signal INS has a high level to turn off the first transistor MP1 and the fourth transistor MP4, the second clock signal CKBS has a low level to turn on the third transistor MP3, the second electrical level signal VGLS has a low level to keep the second transistor MP2 turned on, and the second electrical level signal VGLS is transmitted to the gate electrode of the fifth transistor MP5 via the third transistor MP3 and the second transistor MP2 to turn on the fifth transistor MP5, and then further transmitted to the output terminal OUT via the fifth transistor MP5 as an output signal OUTS of the third stage T3. In addition, the output signal OUTS of the third stage T3 is a low level signal, which is inverse to the initial signal INS, therefore the function of the inverter is accomplished at the third stage T3.

It should be noted that, in the third stage T3, the second clock signal CKBS has a low level to turn on the third transistor MP3, the second electrical level signal VGLS has a low level and is transmitted to the gate electrode of the fifth transistor MP5 via the third transistor MP3 and the second transistor MP2. In addition, when the output signal OUTS changes from a high level to a low level, the electrical potential at the gate electrode of the fifth transistor MP5 is much lowered because of the Bootstrap effect of the second capacitor C2, thus ensuring that the fifth transistor MP5 is completely turned on and the output terminal OUT can completely output a low level of the second electrical level signal VGLS. Therefore, when the first clock signal CKS changes from a low level to a high level, the first clock signal CKS will not affect the electrical potential at the gate electrode of the fifth transistor MP5, and hence will not affect a level value of the output signal OUTS at the output terminal OUT, so that the resultant output signal OUTS is stable.

At the fourth stage T4, as shown in FIG. 6C, the initial signal INS has a high level to turn off the first transistor MP1 and the fourth transistor MP4, the second clock signal CKBS has a high level to turn off the third transistor MP3, the second electrical level signal VGLS has a low level to keep the second transistor MP2 turned on, the first clock signal CKS has a low level and controls the electrical potential at the drain electrode of the second transistor MP2 via the first capacitor C1, the electrical potential at the drain electrode of the second transistor MP2 controls the electrical potential at the gate electrode of the fifth transistor MP5 via the second transistor MP2 to turn on the fifth transistor MP5, so that the second electrical level signal VGLS is transmitted to the output terminal OUT via the fifth transistor MP5 as an output signal OUTS of the fourth stage T4. In addition, the output signal OUTS of the fourth stage T4 is a low level signal, which is inverse to the initial signal INS, therefore the function of the inverter is accomplished at the fourth stage T4.

It should be noted that, in the fourth stage T4, the initial signal INS has a high level to turn off the first transistor MP1, the second clock signal CKBS has a high level to turn off the third transistor MP3, and the electrical potential at the drain electrode of the second transistor MP2 become lower because of the Bootstrap effect of the first capacitor C1 when the first clock signal CKS changes from a high level to a low level, and the electrical potential at the gate electrode of the fifth transistor MP5 is low through the second transistor MP2 which is turned on; so that the fifth transistor MP5 continuously transmits the level value of the second electrical level signal VGLS to the output terminal OUT. Therefore, when the first clock signal CKS changes from a high level to a low level, a level value of the output signal OUTS of the output terminal OUT will not be affected, so that the resultant output signal OUTS is stable.

It can be seen from FIG. 5B that the inverter works alternately in the third stage T3 and the fourth stage T4 between two adjacent second stages T2. In addition, the output signal OUTS of the inverter of the second embodiment in the third stage T3 and the fourth stage T4 is not affected by the change of the first clock signal CKS, therefore the inverter of the second embodiment may obtain a stable output signals OUTS.

Figure 7:
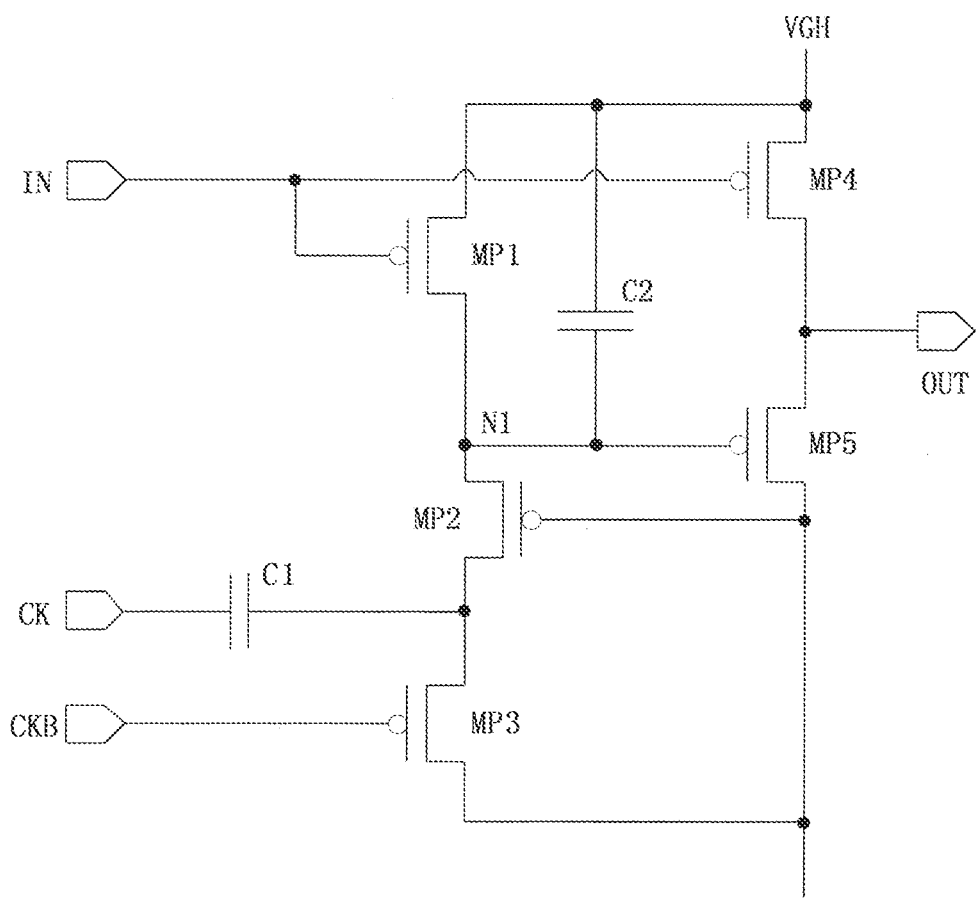
FIG. 7 is a circuit diagram of another inverter according to the third embodiment of the disclosure.

Moreover, FIG. 5A is only a specific example showing an electrical connection of the gate electrode of the fifth transistor MP5 and the second capacitor. In another specific example, as shown in FIG. 7, the gate electrode of the fifth transistor MP5 is electrically connected with the first electrical level signal input terminal VGH via the second capacitor C2, in this case, working status of the inverter shown in FIG. 7 is the same as that of the inverter shown in FIG. 5A. However, compared with the inverter shown in FIG. 5A, in the third stage T3 of the inverter shown in FIG. 7, the electrical potential at the gate electrode of the fifth transistor MP5 will not be lowered even if the output signal OUTS changes from a high level to a low level.

Fourth Embodiment

Figure 8:
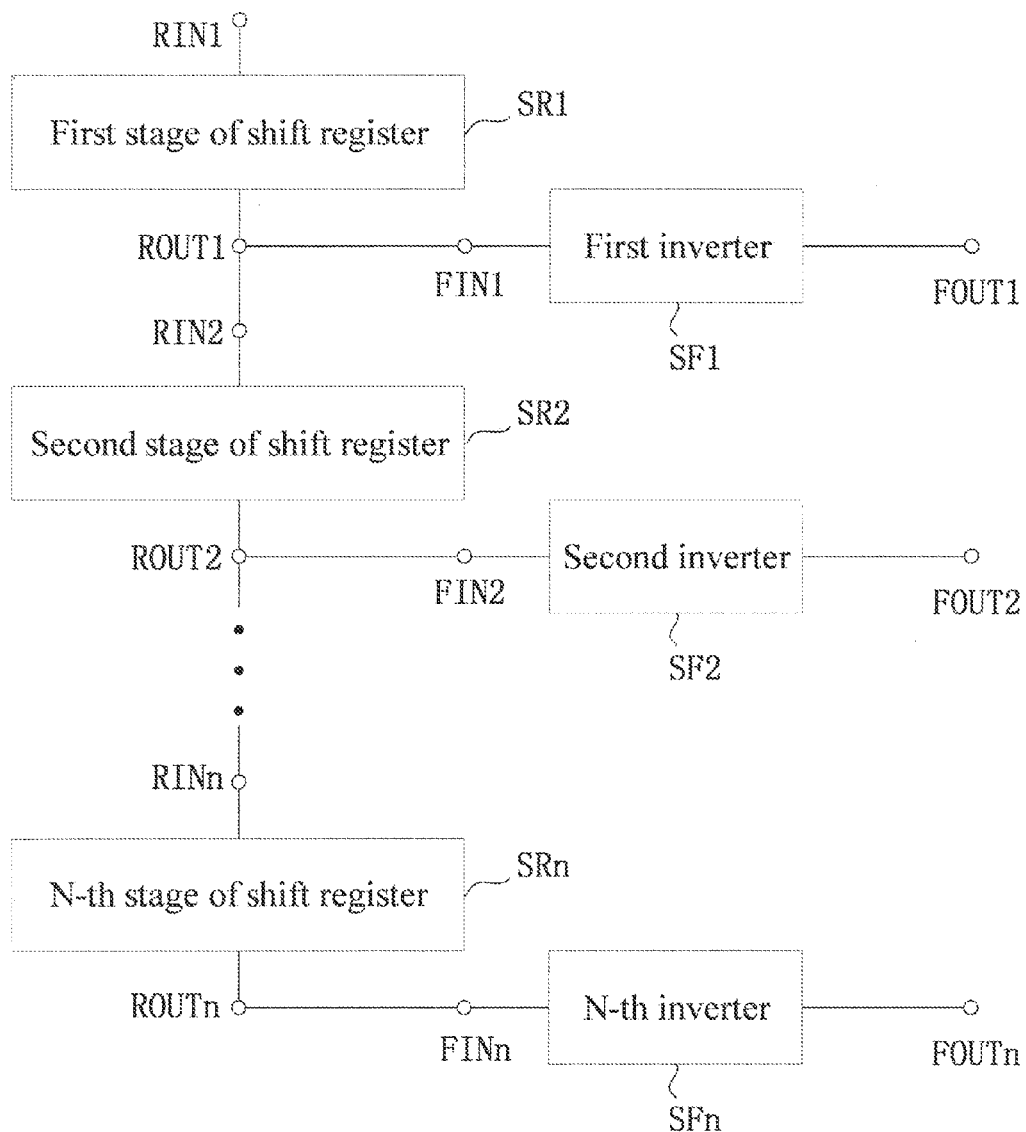
FIG. 8 is a schematic diagram of a structure of a driving circuit according to a fourth embodiment of the disclosure.

The fourth embodiment of the disclosure provides a driving circuit. FIG. 8 is a schematic diagram of a structure of a driving circuit according to the fourth embodiment of the disclosure. As shown in FIG. 8, the driving circuit may include n stages of shift registers and n inverters, where n is an integer greater than 1. The n stages of shift registers include a first stage of shift register, a second stage of shift register, . . . , an n-th stage of shift register (SR1 to SRn), and the n inverters include a first inverter, a second inverter, . . . , an n-th inverter (SF1 to SFn). Each stage of the shift register has an input terminal (with all the input terminals of the stages of shift registers being represented by RIN1 to RINn, respectively) and an output terminal (with all the output terminals of the stages of shift registers being represented by ROUT1 to ROUTn, respectively), and each inverter has an input terminal (with all the input terminals of the inverters being represented by FIN1 to FINn, respectively) and an output terminal (with al the output terminals of the inverters being represented by FOUT1 to FOUTn, respectively); an input terminal RIN1 of the first stage of shift register SR1 is used as an input terminal of the driving circuit. Starting from the second stage of shift register SR2, an input terminal of each stage of shift register is electrically connected with an output terminal of the immediately preceding stage of shift register, and an output terminal ROUTi of each i-th stage of shift register is electrically connected with an input terminal FINi of the i-th inverter, where 1≤i≤n.

The output terminal of each of the n inverters is used as a corresponding output terminal of the driving circuit, and the inverter is configured to invert an output signal of the shift register electrically connected with the inverter, and output the obtained inverted signal as an output signal of the driving circuit. Here, the n inverters of the fourth embodiment are the inverters mentioned in any of the first to third embodiments.

The driving circuit provided in the fourth embodiment of the disclosure adopts inverters with stable output signals, therefore the driving circuit can output stable output signals.

Fifth Embodiment

Figure 9A:
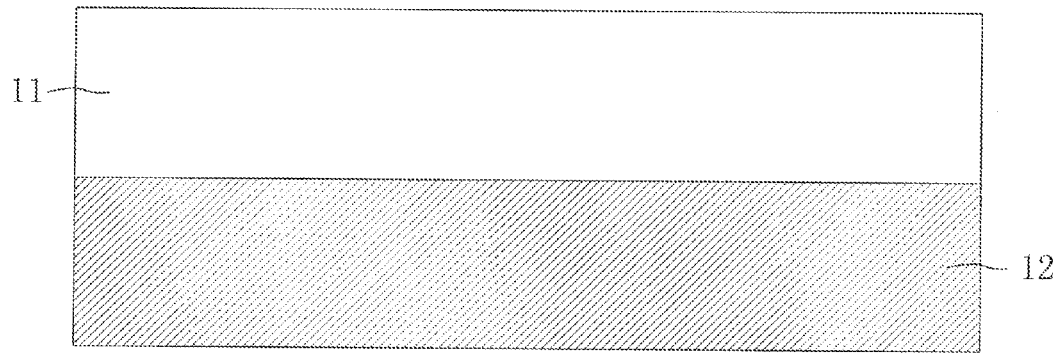
FIG. 9A is a schematic diagram of a structure of a display panel according to a fifth embodiment of the disclosure.

The fifth embodiment of the disclosure provides a display panel. FIG. 9A is a schematic diagram of a structure of a display panel according to in the fifth embodiment of the disclosure. As shown in FIG. 9A, the display panel in the fifth embodiment includes a first substrate 11, and a second substrate 12 arranged opposite to the first substrate 11, where the first substrate 11 may be a color filter substrate, a cover glass, a cover lens or the like, and the second substrate 12 may be a pixel array substrate.

Figure 9B:
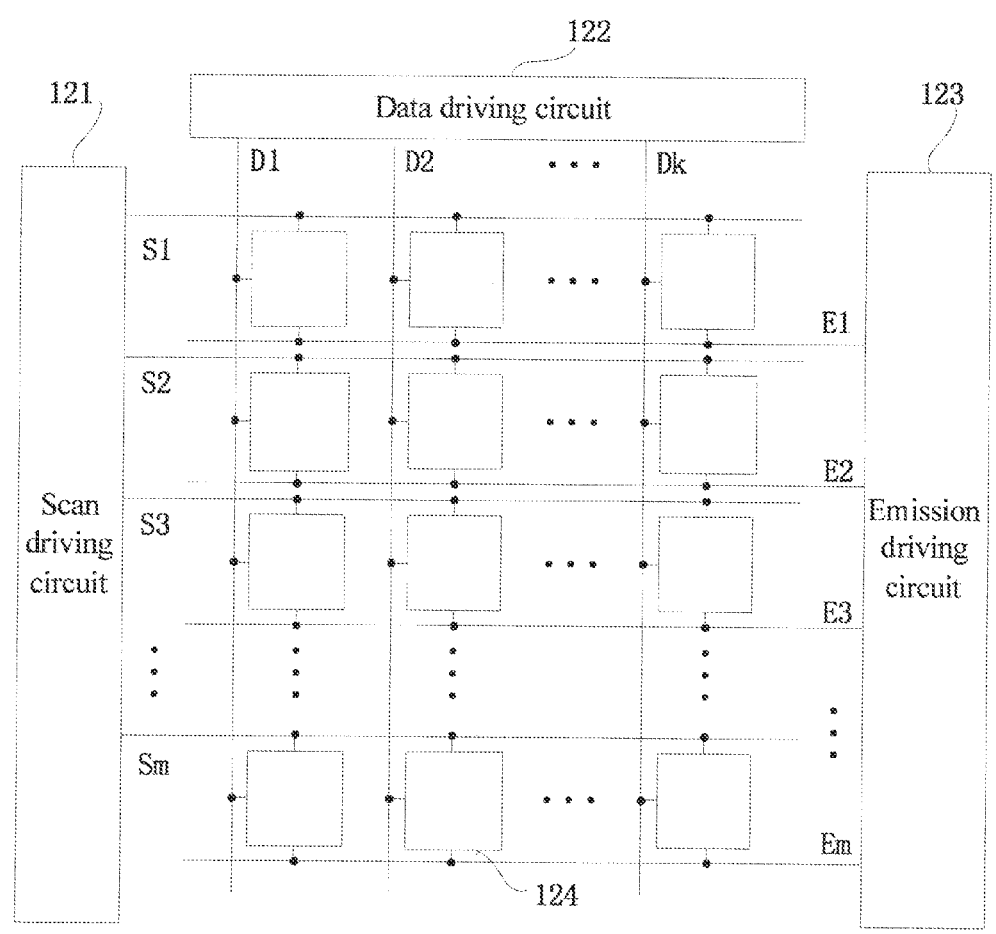
FIG. 9B is a schematic diagram of a structure of a second substrate according to a fifth embodiment of the disclosure.

FIG. 9B is a schematic diagram of a structure of the second substrate according to the fifth embodiment of the disclosure. As shown FIG. 9B, if the second substrate is a pixel array substrate, the second substrate may include a scan driving circuit 121, a data driving circuit 122, an emission driving circuit 123, m scanning lines (S1, S2, . . . , Sm), k data lines (D1, D2, . . . , Dk), m emission driving lines (E1, E2, . . . , Em) and a plurality of pixels 124, where the emission driving circuit 123 in the fifth embodiment is the driving circuit mentioned in the fourth embodiment and is not reiterated in the fifth embodiment.

Specifically, in the fifth embodiment, the scan driving circuit 121 is configured to provide scanning signals for the various scanning lines (S1, S2, . . . , Sm), the data driving circuit 122 is configured to provide data signals for the various data lines (D1, D2, . . . , Dk), and the emission driving circuit 123 is configured to provide emission driving signals for the various emission driving lines (E1, E2, . . . , Em), to implement the node initialization, threshold value compensation, data writing and the like by a pixel compensation circuit in the pixel 124; the pixels 124 are respectively arranged in areas formed by intersecting the scanning lines with the data lines.

By adopting the driving circuit with stable output signals on the second substrate of the display panel, the display panel provided in the fifth embodiment of the disclosure may enable pixels on the second substrate to operate stably, thus obtaining a better display effect of the corresponding display panel.

It is noted that the preferable embodiments and the applied technology principles of the present disclosure are merely described as above. It should be understood for those skilled in the art that the present disclosure is not limited to particular embodiments described herein. Various apparent changes, readjustment and alternative can be made by those skilled in the art without departing from the scope of protection of the present disclosure. Therefore, although the present disclosure is illustrated in detail through the above specific embodiments, the present disclosure is not limited to the above embodiments, and can further include more of other equivalent embodiments without departing from the concept of the present disclosure. The scope of the present disclosure is subject to the appended claims.

What is claimed is:

1. An inverter, comprising a first transistor, a second transistor, a third transistor, a fourth transistor, a fifth transistor, a first capacitor and a second capacitor; wherein:
- a gate electrode of the first transistor is electrically connected with an initial signal input terminal for receiving an initial signal, a source electrode of the first transistor is electrically connected with a first electrical level signal input terminal for receiving a first electrical level signal, and a drain electrode of the first transistor is electrically connected with a source electrode of the second transistor and a gate electrode of the fifth transistor;
- a drain electrode of the second transistor is electrically connected, via the first capacitor, with a first clock signal input terminal for receiving a first clock signal;
- a gate electrode of the third transistor is electrically connected with a second clock signal input terminal for receiving a second clock signal, a source electrode of the third transistor is electrically connected with the drain electrode of the second transistor, and a drain electrode of the third transistor is electrically connected with a second electrical level signal input terminal for receiving a second electrical level signal;
- a gate electrode of the fourth transistor is electrically connected with the initial signal input terminal, a source electrode of the fourth transistor is electrically connected with the first electrical level signal input terminal, and a drain electrode of the fourth transistor is electrically connected with an output terminal for outputting an output signal; and
- a source electrode of the fifth transistor is electrically connected with the output terminal, and a drain electrode of the fifth transistor is electrically connected with the second electrical level signal input terminal;
- wherein reverse conduction of the second transistor is prevented through control over the gate electrode of the second transistor, the second capacitor is configured to maintain an electrical potential at the gate electrode of the fifth transistor, and the initial signal and the output signal are inverse to each other.

2. The inverter according to claim 1, wherein, the gate electrode of the fifth transistor is electrically connected with the output terminal via the second capacitor; or the gate electrode of the fifth transistor is electrically connected with the first electrical level signal input terminal via the second capacitor.

3. The inverter according to claim 2, wherein, the gate electrode of the second transistor is electrically connected with the drain electrode of the second transistor.

4. The inverter according to claim 3, wherein, working status of the inverter comprises:
- a first stage, in which the initial signal controls the first transistor and the fourth transistor to turn off, the second clock signal controls the third transistor to turn on, the second electrical level signal is transmitted to the gate electrode of the second transistor via the third transistor and controls the gate electrode of the second transistor to turn on, and then transmitted to the gate electrode of the fifth transistor via the second transistor and controls the fifth transistor to turn on, and then the second electrical level signal is transmitted to the output terminal via the fifth transistor as an output signal of the first stage;
- a second stage, in which the initial signal controls the first transistor and the fourth transistor to turn on, the first electrical level signal is transmitted to the gate electrode of the fifth transistor via the first transistor and controls the fifth transistor to turn off, the second clock signal controls the third transistor to turn off, and the first electrical level signal is transmitted to the output terminal via the fourth transistor as an output signal of the second stage;
- a third stage, in which the initial signal controls the first transistor and the fourth transistor to turn off, the second clock signal controls the third transistor to turn on, the second electrical level signal is transmitted to the gate electrode of the second transistor via the third transistor and controls the second transistor to turn on, and then transmitted to the gate electrode of the fifth transistor via the second transistor and controls the fifth transistor to turn on, then the second electrical level signal is transmitted to the output terminal via the fifth transistor as an output signal of the third stage; and
- a fourth stage, in which the initial signal controls the first transistor and the fourth transistor to turn off, the second clock signal controls the third transistor to turn off, the first clock signal controls the electrical potential at the gate electrode of the second transistor via the first capacitor to turn on the second transistor, the electrical potential at the gate electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

5. The inverter according to claim 2, wherein, the gate electrode of the second transistor is electrically connected with the second electrical level signal input terminal.

6. The inverter according to claim 5, wherein, working status of the inverter comprises:
- a first stage, in which the initial signal controls the first transistor and the fourth transistor to turn off, the second clock signal controls the third transistor to turn on, the second electrical level signal controls the second transistor to turn on and is transmitted to the gate electrode of the fifth transistor sequentially via the third transistor and the second transistor to control the fifth transistor to turn on, and then second electrical level signal is transmitted to the output terminal via the fifth transistor as an output signal of the first stage;
- a second stage, in which the initial signal controls the first transistor and the fourth transistor to turn on, the first electrical level signal is transmitted to the gate electrode of the fifth transistor via the first transistor and controls the fifth transistor to turn off, the second electrical level signal continues controlling to turn on the second transistor to turn on, the second clock signal controls the third transistor to turn off, and the first electrical level signal is transmitted to the output terminal via the fourth transistor as an output signal of the second stage;
- a third stage, in which the initial signal controls the first transistor and the fourth transistor to turn off, the second clock signal controls the third transistor to turn on, the second electrical level signal continues controlling the second transistor to turn on, the second electrical level signal is transmitted to the gate electrode of the fifth transistor sequentially via the third transistor and the second transistor to control the fifth transistor to turn on, and the second electrical level signal is transmitted to the output terminal via the fifth transistor as an output signal of the third stage; and a fourth stage, in which the initial signal controls the first transistor and the fourth transistor to turn off, the second clock signal controls the third transistor to turn off, the second electrical level signal continues controlling the second transistor to turn on, the first clock signal controls the electrical potential at the drain electrode of the second transistor via the first capacitor, the electrical potential at the drain electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

7. The inverter according to claim 1, wherein, the first transistor, the second transistor, the third transistor, the fourth transistor and the fifth transistor are all NMOS transistors or PMOS transistors.

8. The inverter according to claim 1, wherein, the initial signal, the output signal, the first clock signal and the second clock signal are all pulse signals, wherein the first clock signal and the second clock signal are inverse to each other.

9. The inverter according to claim 1, wherein, the first electrical level signal and the second electrical level signal are both constant signals.

10. A driving circuit, comprising an inverter, wherein the inverter comprises a first transistor, a second transistor, a third transistor, a fourth transistor, a fifth transistor, a first capacitor and a second capacitor; wherein:
  a gate electrode of the first transistor is electrically connected with an initial signal input terminal for receiving an initial signal, a source electrode of the first transistor is electrically connected with a first electrical level signal input terminal for receiving a first electrical level signal, and a drain electrode of the first transistor is electrically connected with a source electrode of the second transistor and a gate electrode of the fifth transistor;
  a drain electrode of the second transistor is electrically connected, via the first capacitor, with a first clock signal input terminal for receiving a first clock signal;
  a gate electrode of the third transistor is electrically connected with a second clock signal input terminal for receiving a second clock signal, a source electrode of the third transistor is electrically connected with the drain electrode of the second transistor, and a drain electrode of the third transistor is electrically connected with a second electrical level signal input terminal for receiving a second electrical level signal;
  a gate electrode of the fourth transistor is electrically connected with the initial signal input terminal, a source electrode of the fourth transistor is electrically connected with the first electrical level signal input terminal, and a drain electrode of the fourth transistor is electrically connected with an output terminal for outputting an output signal; and
  a source electrode of the fifth transistor is electrically connected with the output terminal, and a drain electrode of the fifth transistor is electrically connected with the second electrical level signal input terminal;
  wherein reverse conduction of the second transistor is prevented through control over the gate electrode of the second transistor, the second capacitor is configured to maintain an electrical potential at the gate electrode of the fifth transistor, and the initial signal and the output signal are inverse to each other.

11. A display panel, comprising the driving circuit in claim 10.

12. The driving circuit according to claim 10, wherein, the gate electrode of the fifth transistor is electrically connected with the output terminal via the second capacitor; or the gate electrode of the fifth transistor is electrically connected with the first electrical level signal input terminal via the second capacitor.

13. The driving circuit according to claim 12, wherein, the gate electrode of the second transistor is electrically connected with the drain electrode of the second transistor.

14. The driving circuit according to claim 13, wherein, working status of the inverter comprises:
  a first stage, in which the initial signal controls the first transistor and the fourth transistor to turn off, the second clock signal controls the third transistor to turn on, the second electrical level signal is transmitted to the gate electrode of the second transistor via the third transistor and controls the gate electrode of the second transistor to turn on, and then transmitted to the gate electrode of the fifth transistor via the second transistor and controls the fifth transistor to turn on, and then the second electrical level signal is transmitted to the output terminal via the fifth transistor as an output signal of the first stage;
  a second stage, in which the initial signal controls the first transistor and the fourth transistor to turn on, the first electrical level signal is transmitted to the gate electrode of the fifth transistor via the first transistor and controls the fifth transistor to turn off, the second clock signal controls the third transistor to turn off, and the first electrical level signal is transmitted to the output terminal via the fourth transistor as an output signal of the second stage;
  a third stage, in which the initial signal controls the first transistor and the fourth transistor to turn off, the second clock signal controls the third transistor to turn on, the second electrical level signal is transmitted to the gate electrode of the second transistor via the third transistor and controls the second transistor to turn on, and then transmitted to the gate electrode of the fifth transistor via the second transistor and controls the fifth transistor to turn on, then the second electrical level signal is transmitted to the output terminal via the fifth transistor as an output signal of the third stage; and
  a fourth stage, in which the initial signal controls the first transistor and the fourth transistor to turn off, the second clock signal controls the third transistor to turn off, the first clock signal controls the electrical potential at the gate electrode of the second transistor via the first capacitor to turn on the second transistor, the electrical potential at the gate electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

15. The driving circuit according to claim 12, wherein, the gate electrode of the second transistor is electrically connected with the second electrical level signal input terminal.

16. The driving circuit according to claim 15, wherein, working status of the inverter comprises:
  a first stage, in which the initial signal controls the first transistor and the fourth transistor to turn off, the second clock signal controls the third transistor to turn on, the second electrical level signal controls the second transistor to turn on and is transmitted to the gate electrode of the fifth transistor sequentially via the third transistor and the second transistor to control the fifth transistor to turn on, and then second electrical level signal is transmitted to the output terminal via the fifth transistor as an output signal of the first stage;

a second stage, in which the initial signal controls the first transistor and the fourth transistor to turn on, the first electrical level signal is transmitted to the gate electrode of the fifth transistor via the first transistor and controls the fifth transistor to turn off, the second electrical level signal continues controlling to turn on the second transistor to turn on, the second clock signal controls the third transistor to turn off, and the first electrical level signal is transmitted to the output terminal via the fourth transistor as an output signal of the second stage;

a third stage, in which the initial signal controls the first transistor and the fourth transistor to turn off, the second clock signal controls the third transistor to turn on, the second electrical level signal continues controlling the second transistor to turn on, the second electrical level signal is transmitted to the gate electrode of the fifth transistor sequentially via the third transistor and the second transistor to control the fifth transistor to turn on, and the second electrical level signal is transmitted to the output terminal via the fifth transistor as an output signal of the third stage; and a fourth stage, in which the initial signal controls the first transistor and the fourth transistor to turn off, the second clock signal controls the third transistor to turn off, the second electrical level signal continues controlling the second transistor to turn on, the first clock signal controls the electrical potential at the drain electrode of the second transistor via the first capacitor, the electrical potential at the drain electrode of the second transistor controls the electrical potential at the gate electrode of the fifth transistor via the second transistor to turn on the fifth transistor, and the second electrical level signal is transmitted to the output terminal via the fifth transistor as an output signal of the fourth stage.

17. The driving circuit according to claim 10, wherein, the first transistor, the second transistor, the third transistor, the fourth transistor and the fifth transistor are all NMOS transistors or PMOS transistors.

18. The driving circuit according to claim 10, wherein, the initial signal, the output signal, the first clock signal and the second clock signal are all pulse signals, wherein the first clock signal and the second clock signal are inverse to each other.

19. The driving circuit according to claim 10, wherein, the first electrical level signal and the second electrical level signal are both constant signals.

* * * * *